United States Patent
Li et al.

(10) Patent No.: US 12,353,259 B2
(45) Date of Patent: Jul. 8, 2025

(54) TOUCH MODULE AND TERMINAL DEVICE

(71) Applicant: Huawei Technologies Co., Ltd., Shenzhen (CN)

(72) Inventors: Jiewei Li, Wuhan (CN); Weibo Jia, Xi'an (CN); Yapeng Li, Shenzhen (CN); Lubing Xie, Xi'an (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 347 days.

(21) Appl. No.: 17/793,869

(22) PCT Filed: Dec. 10, 2020

(86) PCT No.: PCT/CN2020/135089
§ 371 (c)(1),
(2) Date: Jul. 19, 2022

(87) PCT Pub. No.: WO2021/147550
PCT Pub. Date: Jul. 29, 2021

(65) Prior Publication Data
US 2023/0058372 A1 Feb. 23, 2023

(30) Foreign Application Priority Data
Jan. 20, 2020 (CN) .......................... 202010065440.0

(51) Int. Cl.
*G06F 1/20* (2006.01)
*G06F 3/041* (2006.01)
(Continued)

(52) U.S. Cl.
CPC .............. *G06F 1/203* (2013.01); *G06F 1/20* (2013.01); *G06F 3/0412* (2013.01);
(Continued)

(58) Field of Classification Search
CPC .............. H04M 1/0266; H04M 1/026; H04M 2250/22; H04M 1/0249; H04M 2201/38;
(Continued)

(56) References Cited

U.S. PATENT DOCUMENTS 8,905,317 B1 * 12/2014 Hsu ...................... H01Q 1/2225
235/487
12,033,557 B2 * 7/2024 Jung ...................... H04M 1/02
(Continued)

FOREIGN PATENT DOCUMENTS

| CN | 102480872 A | 5/2012 |
| CN | 102819346 A | 12/2012 |

(Continued)

*Primary Examiner* — Michael A Matey
(74) *Attorney, Agent, or Firm* — Leydig, Voit & Mayer, Ltd.

(57) ABSTRACT

A touch module is provided, which includes a base layer, an intermediate layer, and a touch layer. The intermediate layer is mounted on the base layer, and the touch layer is mounted on the intermediate layer. The intermediate layer has a heat dissipation substrate and foam that are attached to each other, the heat dissipation substrate has an etched surface and a back surface that are opposite to each other, and a near field communication coil is etched on the etched surface. A terminal device including a housing and a display panel is also provided. The display panel is disposed on the housing, and the touch module is disposed on the display panel. The near field communication coil is integrated on the heat dissipation substrate.

18 Claims, 7 Drawing Sheets

(51) Int. Cl.
*H05K 7/20* (2006.01)
*H10K 59/12* (2023.01)
*H10K 59/80* (2023.01)

(52) U.S. Cl.
CPC ....... *H05K 7/2039* (2013.01); *H05K 7/20963* (2013.01); *G06F 2203/04103* (2013.01); *H10K 59/12* (2023.02); *H10K 59/8794* (2023.02)

(58) Field of Classification Search
CPC ...... H04M 1/0277; G06F 1/20; G06F 3/0412; G06F 2203/04103; G06F 3/0488; G06F 3/041; G06F 3/016; G06F 1/1698; H05K 7/2039; H05K 1/0216; H05K 1/144; H05K 2201/10128; H05K 7/20963; H05K 2201/10371; H01Q 1/243; H01Q 13/10; H01Q 7/00; B32B 2457/20; H01M 50/247
See application file for complete search history.

(56) References Cited

U.S. PATENT DOCUMENTS

| | | | | |
|---|---|---|---|---|
| 2006/0281500 A1* | 12/2006 | Huang | | H01Q 21/28 455/90.3 |
| 2015/0123860 A1* | 5/2015 | Park | | H01Q 1/526 343/720 |
| 2016/0088769 A1* | 3/2016 | Hsiao | | G06F 1/203 165/104.26 |
| 2016/0210616 A1* | 7/2016 | Lee | | G06Q 20/3274 |
| 2017/0047791 A1* | 2/2017 | Jang | | H02J 50/90 |
| 2018/0084680 A1* | 3/2018 | Jarvis | | H05K 1/148 |
| 2018/0205131 A1* | 7/2018 | Hwang | | H04M 1/026 |
| 2021/0168230 A1* | 6/2021 | Baker | | G06F 1/1698 |
| 2021/0168231 A1* | 6/2021 | Baker | | H05K 1/189 |
| 2023/0180448 A1* | 6/2023 | Wang | | H05K 3/341 343/700 R |
| 2023/0221802 A1* | 7/2023 | Iranmanesh | | H04M 1/0264 361/679.3 |
| 2023/0224391 A1* | 7/2023 | Hill | | H04M 1/0264 455/566 |
| 2023/0224393 A1* | 7/2023 | Froese | | H04M 1/035 455/575.8 |

FOREIGN PATENT DOCUMENTS

| | | |
|---|---|---|
| CN | 102749771 B | 2/2015 |
| CN | 104485983 A | 4/2015 |
| CN | 205247351 U | 5/2016 |
| CN | 105824460 A | 8/2016 |
| CN | 206134917 U | 4/2017 |
| CN | 206931708 U | 1/2018 |
| CN | 108538864 A | 9/2018 |
| CN | 110633031 A | 12/2019 |
| KR | 101416581 B1 | 8/2014 |

\* cited by examiner

TOUCH MODULE AND TERMINAL DEVICE

CROSS-REFERENCE TO RELATED APPLICATIONS

This application is a National Stage of International Application No. PCT/CN2020/135089, filed on Dec. 10, 2020, which claims priority to Chinese Patent Application No. 202010065440.0, filed on Jan. 20, 2020. All of the aforementioned patent applications are hereby incorporated by reference in their entireties.

TECHNICAL FIELD

Embodiments of this application relate to the field of communication technologies, and in particular, to a touch module and a terminal device.

BACKGROUND

Currently, because heat dissipation performance of a flexible OLED (Organic Light Emitting Display) screen is not as good as that of a rigid screen, to conduct heat away in time during running of the screen, a layer of copper foil is usually pasted on a lower surface of the flexible OLED screen as a heat dissipation layer. With improvement of intelligence of an electronic product, an NFC (Near Field Communication) function becomes a standard configuration. Currently, a popular method is to weld an NFC coil to an FPC (Flexible Printed Circuit), and then attach the NFC coil between the FPC and the copper foil. However, an entire-surface copper foil blocks an NFC antenna signal. To resolve this problem, an opening needs to be disposed on the copper foil.

As shown in FIG. 1, a layer of a support film needs to be attached under a flexible AMOLED (Active-matrix Organic Light Emitting Display) screen (including a PI (Polyimide) screen, an LTPS (Low Temperature Poly-Silicon) screen, and an OLED screen), to maintain appearance stability of the screen in a manufacturing process, so that deformation of the screen does not cause a large quantity of defects. A layer of copper foil is attached under foam, to ensure that the heat generated during the running of the screen can be dissipated in time. This may prevent a service life of the OLED screen from being shortened due to overheating, or prevent an occurrence of a ghost image. An NFC coil is manufactured, wrapped with a shielding adhesive film, and then attached between the copper foil and an M-FPC (Main Flexible Printed Circuit), to implement a near field communication function.

However, the conventional technology mainly has the following disadvantages:
1. The NFC coil and the adhesive film that wraps the NFC coil increase the thickness and weight of the entire product.
2. The copper foil used as the heat dissipation layer blocks an NFC signal. Therefore, an opening structure needs to be made on the copper foil, the process is complex, and a yield loss occurs.
3. Wrapping of the NFC layer hinders spread and propagation of heat, and is not conducive to the copper foil to dissipate the heat generated by the OLED screen.
4. A layer of foam and a support film are disposed between the copper foil and the flexible screen, and the foam and the support film are heat insulation materials, which are not conducive to heat conduction and dissipation.

SUMMARY

This application provides a touch module and a terminal device, to resolve a technical problem that a flexible OLED screen has poor heat dissipation performance and is prone to block an NFC signal in the conventional technology.

According to a first aspect, this application provides a touch module. The touch module includes a base layer, an intermediate layer, and a touch layer. The intermediate layer is mounted on the base layer, and the touch layer is mounted on the intermediate layer. The intermediate layer has a heat dissipation substrate and foam that are attached to each other, the heat dissipation substrate has an etched surface and a back surface that are opposite to each other, and a near field communication coil is etched on the etched surface. According to the solution provided in this embodiment, the near field communication coil used to receive and transmit a signal is integrated on the heat dissipation substrate used for heat dissipation, so that the heat dissipation substrate performs functions of heat dissipation and near field communication simultaneously. In a multiplexing manner, the touch module can be thin and light, and has a good heat dissipation effect. The NFC signal is not blocked, and a yield is improved.

In a possible design, the etched surface is a metal foil, the metal foil has a heat dissipation part, and the near field communication coil is etched around the heat dissipation part towards an edge of the metal foil on the metal foil. A surface that is of the heat dissipation substrate and that is not provided with the metal foil is attached to the base layer, and the foam is attached to the metal foil. According to the solution provided in this embodiment, the metal foil is used as an etched surface to form a coil structure, physical properties of the near field communication coil are fully utilized, and the near field communication coil is etched around the heat dissipation part. This greatly reduces a space requirement of the intermediate layer, and makes the intermediate layer lighter and thinner while simultaneously implementing heat dissipation and near field communication functions.

In a possible design, a support film is further disposed on the intermediate layer, one surface of the support film is attached to a surface that is of the foam and that is away from the heat dissipation substrate, and the other surface of the support film is attached to the touch layer. According to the solution provided in this embodiment, the support film can maintain appearance stability of the screen in a manufacturing process, so that deformation of the touch layer does not cause a large quantity of defects, and the support film supports both the touch layer and the intermediate layer.

In a possible design, the etched surface is a support film, the support film has a heat dissipation part, and the near field communication coil is etched around the heat dissipation part towards an edge of the support film on the support film. The support film is attached to the touch layer, the back surface is attached to the foam, and a surface that is of the foam and that is away from the heat dissipation substrate is attached to the base layer. According to the solution provided in this embodiment, the support film is used as an etched surface to form a coil structure, physical properties of the near field communication coil are fully utilized, and the near field communication coil is etched around the heat dissipation part. In addition, the physical properties of the support film are used to support both the touch layer and the intermediate layer. This further reduces a space requirement of the intermediate layer, and further makes the intermediate layer lighter and thinner while simultaneously implementing support, heat dissipation, and near field communication functions.

In a possible design, an area of the heat dissipation part accounts for ½ to ⅔ of a total area of the heat dissipation substrate. According to the solution provided in this embodiment, proportions of the heat dissipation part and the near field communication coil on the heat dissipation substrate are properly allocated, so that the heat dissipation substrate can not only achieve a better heat dissipation effect and unimpeded near field communication, but also enhance hardness of a central area of the heat dissipation substrate.

In a possible design, a center of the heat dissipation part coincides with a center of the heat dissipation substrate. According to the solution provided in this embodiment, heat is conducted from the central area of the heat dissipation substrate to the base layer, and a physical center of the heat dissipation part and a physical center of the heat dissipation substrate are at a same point. This further enhances hardness of the heat dissipation substrate.

In a possible design, the intermediate layer and the base layer are fastened together by using a connection part. According to the solution provided in this embodiment, firmness of connection between the intermediate layer and the base layer is enhanced.

In a possible design, two ends of the connection part are respectively connected to an edge of the heat dissipation substrate and an edge of the base layer. According to the solution provided in this embodiment, when the connection part is connected to the edge of the heat dissipation substrate and the edge of the base layer, a signal of the near field communication coil is not blocked, and a heat dissipation effect of the heat dissipation substrate is not affected.

In a possible design, the connection part passes through an edge of the foam. According to the solution provided in this embodiment, when the support film is an etched surface, firmness of connection between the intermediate layer and the base layer can be further enhanced.

In a possible design, the connection part is connected and fastened in a welding manner. According to the solution provided in this embodiment, an overall appearance of the touch module is flat.

According to a second aspect, this application provides a terminal device, including a housing and a display panel. The display panel is disposed on the housing, and the touch module according to the first aspect is disposed on the display panel. According to the solution provided in this embodiment, the terminal device may have better heat dissipation performance, a good near field communication effect, a lighter weight, and a thinner thickness, and is portable, wearable, and easy to use.

It can be learned that in the foregoing aspects, the near field communication coil is integrated on the heat dissipation substrate, to perform functions of heat dissipation and near field communication simultaneously. Moreover, the support film and the near field communication coil are integrated on the heat dissipation substrate, to perform functions of heat dissipation and an NFC coil while supporting the flexible touch layer, thereby making the touch module lighter and thinner. Therefore, the touch module can be used in a device that adopts a flexible AMOLED screen, such as a wearable device, a mobile phone, or a PC (Personal Computer).

REFERENCE NUMERALS

1—Base layer;
2—Intermediate layer;
  21—Heat dissipation substrate;
    211—Near field communication coil;
    212—Heat dissipation part;
  22—Foam;
  23—Support part;
3—Touch layer;
31—Flexible AMOLED screen;
32—Touch panel;
33—Pol;
4—Connection part;
5—COF;
6—PI bent portion;
7—TP FPC;

8—Terminal device;
  81—Housing;
  82—Display panel;
  83—Touch module.

DESCRIPTION OF EMBODIMENTS

To better understand technical solutions of this application, the following describes embodiments of this application in detail with reference to the accompanying drawings.

It should be clear that the described embodiments are merely some rather than all of embodiments of this application. All other embodiments obtained by persons of ordinary skill in the art based on embodiments of this application without creative efforts shall fall within the protection scope of this application.

Terms used in embodiments of this application are only used for explaining specific embodiments of this application, but are not intended to limit this application. Terms "a", "the", and "this" of singular forms used in embodiments and the appended claims of this application are also intended to include plural forms, unless otherwise specified in the context clearly.

It should be noted that orientation words such as "above", "below", "left", and "right" described in embodiments of this application are described from perspectives shown in the accompanying drawings, and should not be construed as a limitation on embodiments of this application. Moreover, in the context, it should be also understood that, when it is mentioned that one element is connected "above" or "below" another element, the element can be directly connected "above" or "below" the another element, or may be indirectly connected "above" or "below" the another element through an intermediate element.

Figure 1:
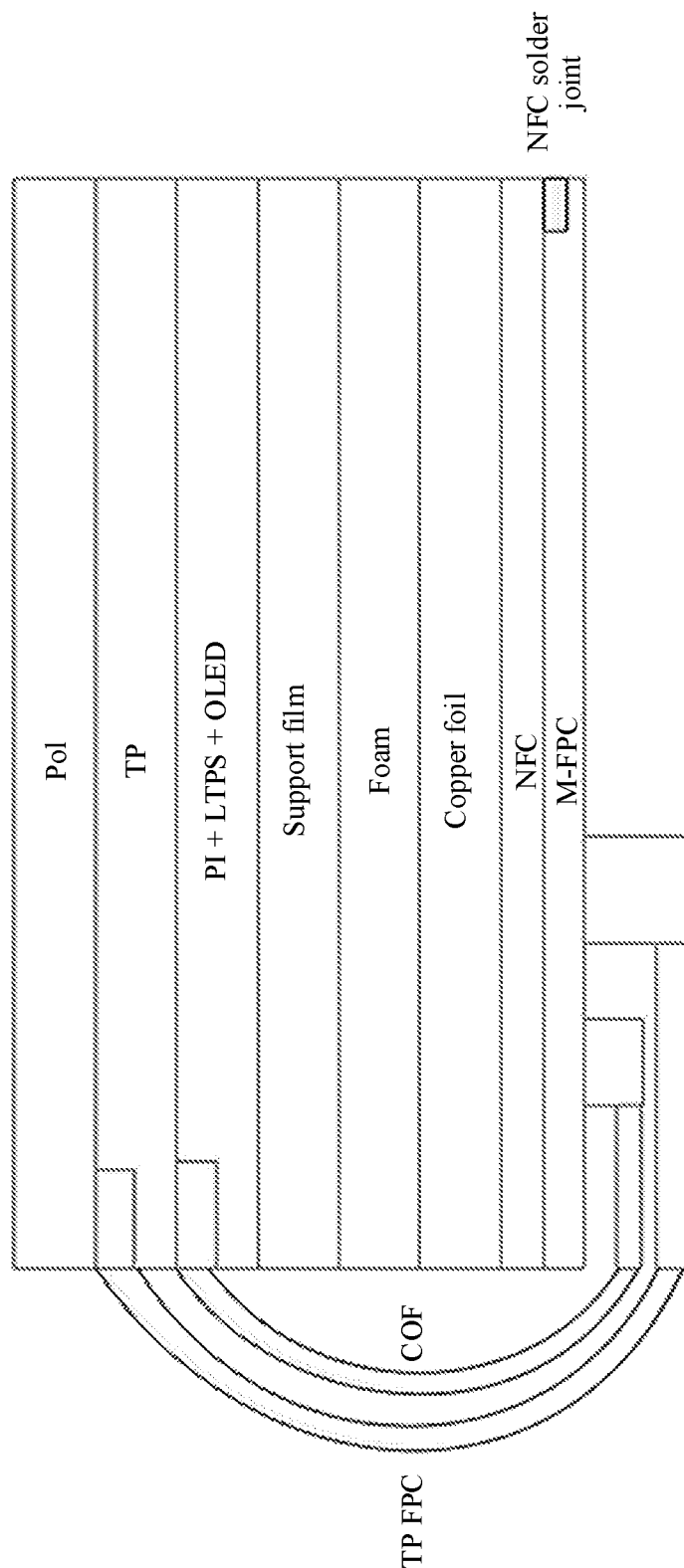
FIG. 1 is a schematic diagram of a structure of a touch module in the conventional technology.
Figure 2:
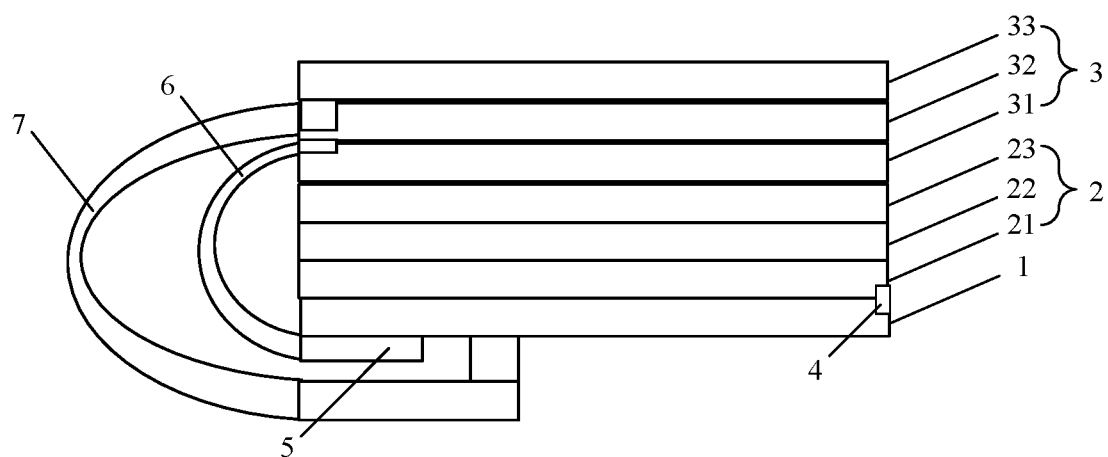
FIG. 2 is a schematic diagram of a structure of a touch module according to Embodiment 1 of this application.
Figure 3:
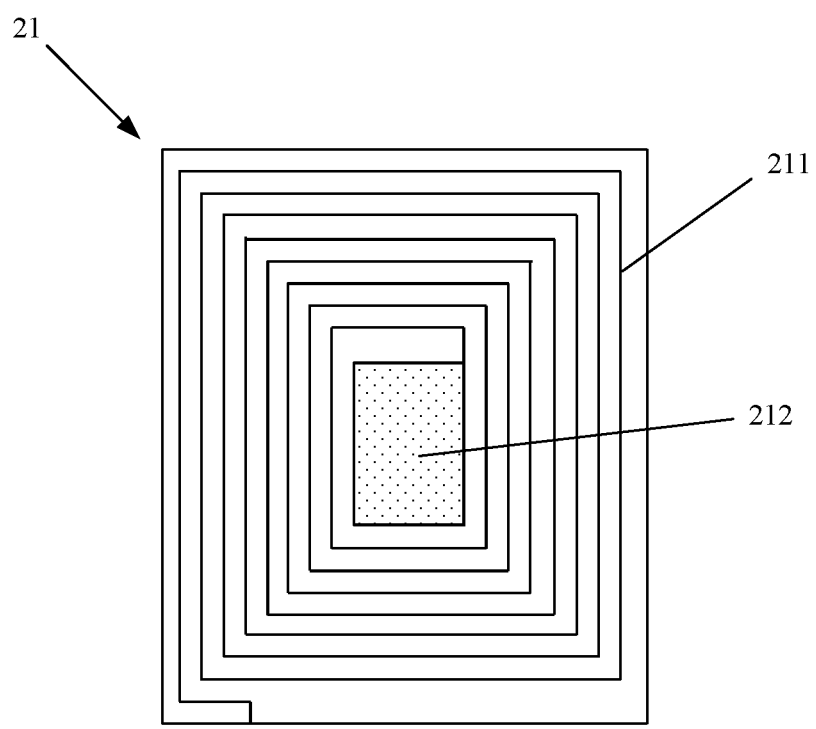
FIG. 3 is a schematic planar diagram of a heat dissipation substrate in a touch module according to Embodiment 1 of this application.
Figure 4:
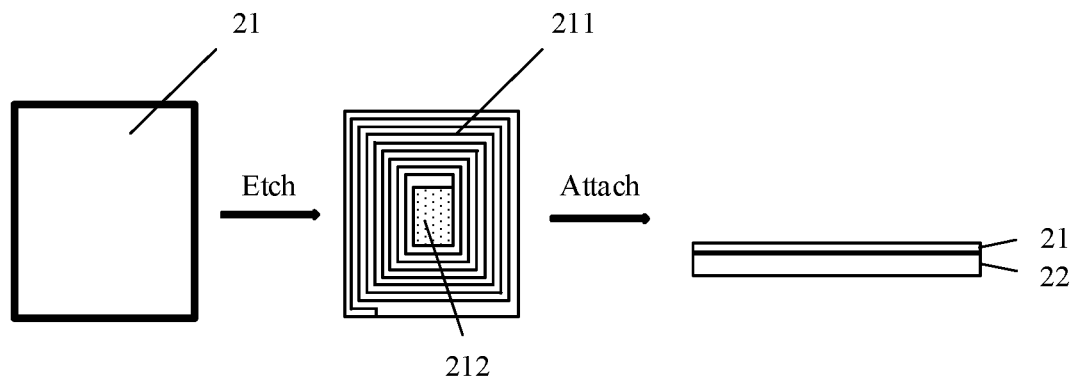
FIG. 4 is a schematic diagram of a manufacturing process of an intermediate layer in a touch module according to Embodiment 1 of this application.
Figure 5:
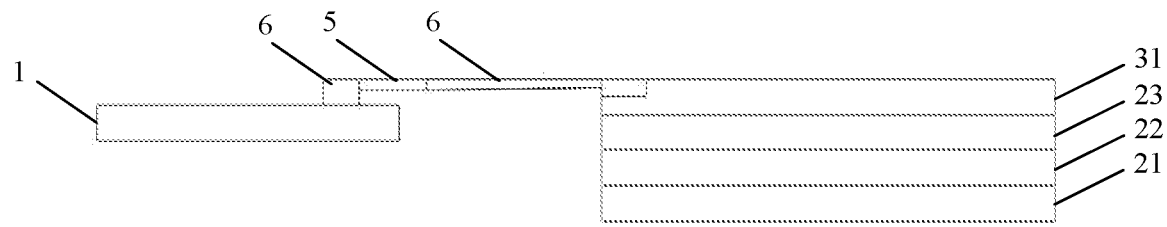
FIG. 5 is a schematic diagram of a manufacturing process of combining a base layer and a flexible AMOLED in a touch module according to Embodiment 1 of this application.
Figure 6:
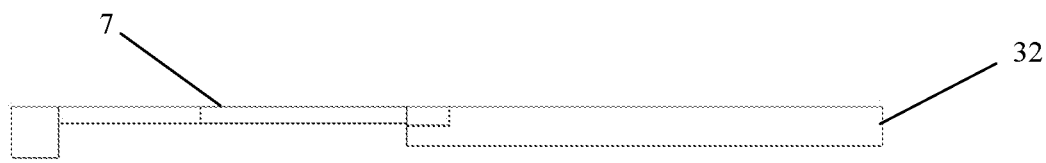
FIG. 6 is a schematic diagram of a manufacturing process of combining a base layer and a touch panel in a touch module according to Embodiment 1 of this application.
Figure 7:
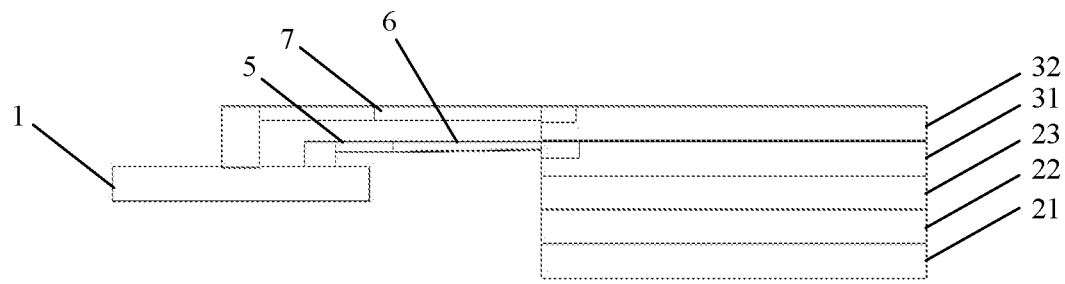
FIG. 7 is a schematic diagram of a manufacturing process of combining an intermediate layer and a touch panel in a touch module according to Embodiment 1 of this application.
Figure 8:
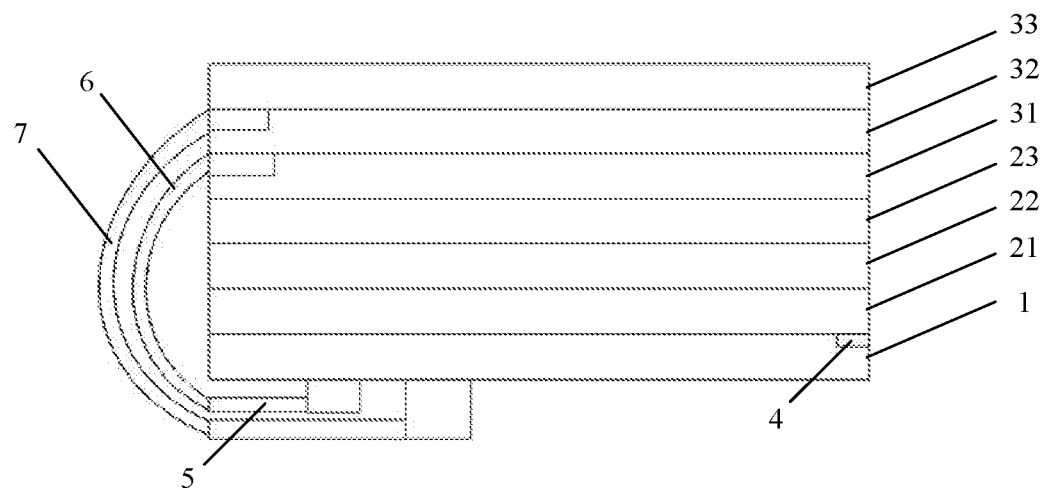
FIG. 8 is a schematic diagram of a manufacturing process of combining a base layer and an intermediate layer in a touch module according to Embodiment 1 of this application.
Figure 9:
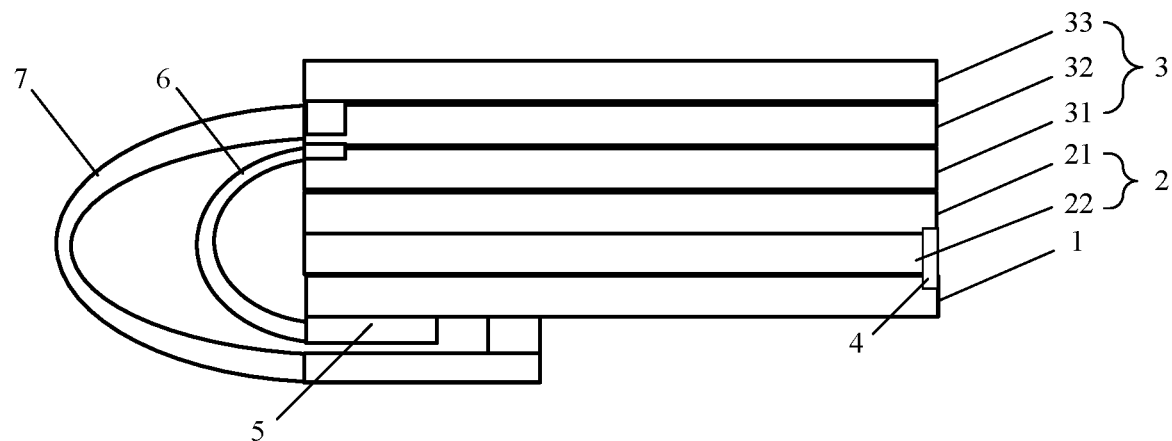
FIG. 9 is a schematic diagram of a structure of a touch module according to Embodiment 2 of this application.
Figure 10:
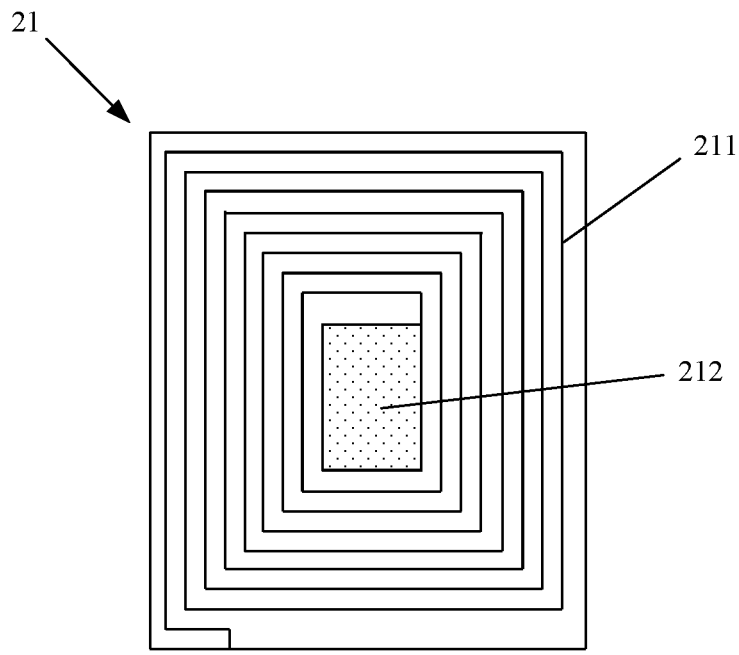
FIG. 10 is a schematic planar diagram of a heat dissipation substrate in a touch module according to Embodiment 2 of this application.
Figure 11:
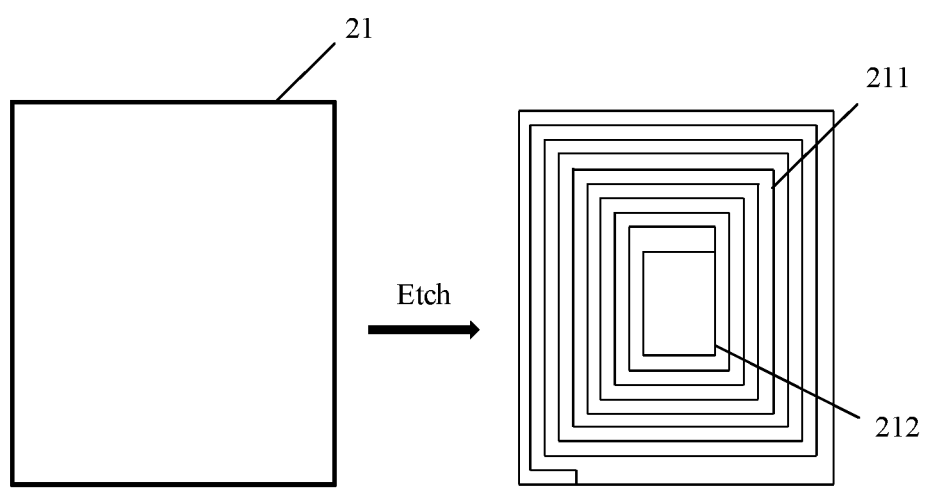
FIG. 11 is a schematic diagram of a manufacturing process of an intermediate layer in a touch module according to Embodiment 2 of this application.
Figure 12:
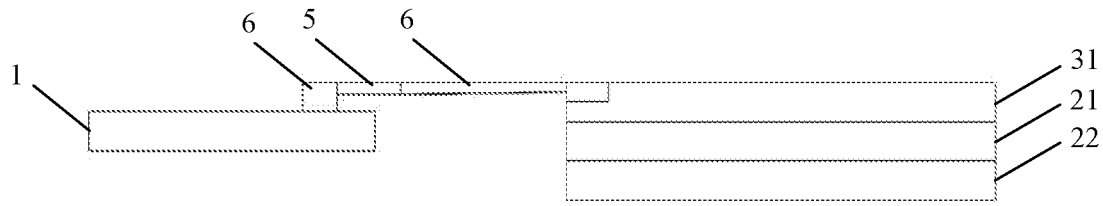
FIG. 12 is a schematic diagram of a manufacturing process of combining a base layer and a flexible AMOLED in a touch module according to Embodiment 2 of this application.
Figure 13:
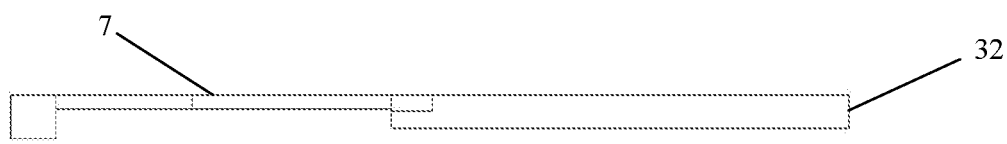
FIG. 13 is a schematic diagram of a manufacturing process of combining a base layer and a touch panel in a touch module according to Embodiment 2 of this application.
Figure 14:
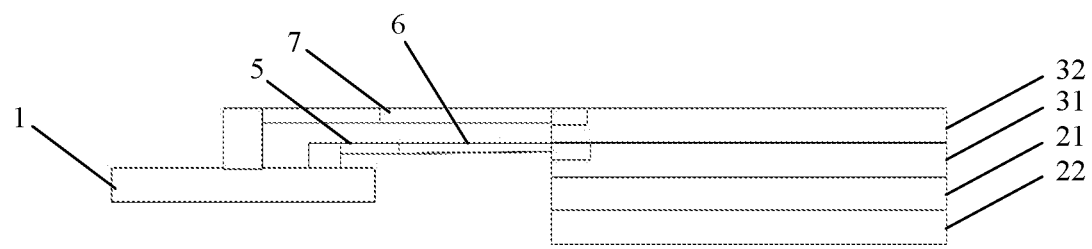
FIG. 14 is a schematic diagram of a manufacturing process of combining an intermediate layer and a touch panel in a touch module according to Embodiment 2 of this application.
Figure 15:
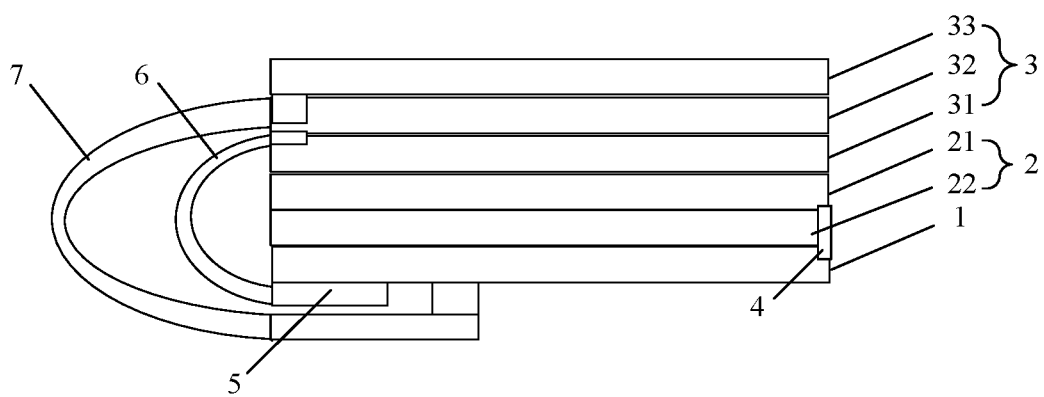
FIG. 15 is a schematic diagram of a manufacturing process of combining a base layer and an intermediate layer in a touch module according to Embodiment 2 of this application.
Figure 16:
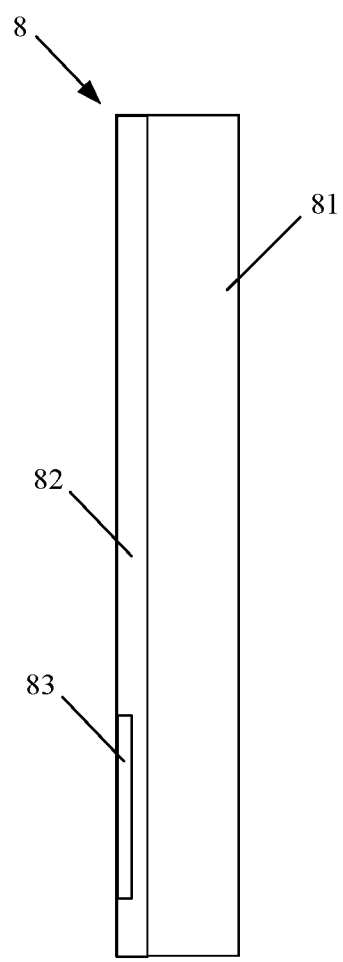
FIG. 16 is a schematic diagram of a structure of a terminal device according to Embodiment 3 of this application.

Refer to FIG. 1 to FIG. 16. FIG. 1 is a schematic diagram of a structure of a touch module in the conventional technology. FIG. 2 is a schematic diagram of a structure of a touch module according to Embodiment 1 of this application. FIG. 3 is a schematic planar diagram of a heat dissipation substrate in a touch module according to Embodiment 1 of this application. FIG. 4 is a schematic diagram of a manufacturing process of an intermediate layer in a touch module according to Embodiment 1 of this application. FIG. 5 is a schematic diagram of a manufacturing process of combining a base layer and a flexible AMOLED in a touch module according to Embodiment 1 of this application. FIG. 6 is a schematic diagram of a manufacturing process of combining a base layer and a touch panel in a touch module according to Embodiment 1 of this application. FIG. 7 is a schematic diagram of a manufacturing process of combining an intermediate layer and a touch panel in a touch module according to Embodiment 1 of this application. FIG. 8 is a schematic diagram of a manufacturing process of combining a base layer and an intermediate layer in a touch module according to Embodiment 1 of this application. FIG. 9 is a schematic diagram of a structure of a touch module according to Embodiment 2 of this application. FIG. 10 is a schematic planar diagram of a heat dissipation substrate in a touch module according to Embodiment 2 of this application. FIG. 11 is a schematic diagram of a manufacturing process of an intermediate layer in a touch module according to Embodiment 2 of this application. FIG. 12 is a schematic diagram of a manufacturing process of combining a base layer and a flexible AMOLED in a touch module according to Embodiment 2 of this application. FIG. 13 is a schematic diagram of a manufacturing process of combining a base layer and a touch panel in a touch module according to Embodiment 2 of this application. FIG. 14 is a schematic diagram of a manufacturing process of combining an intermediate layer and a touch panel in a touch module according to Embodiment 2 of this application. FIG. 15 is a schematic diagram of a manufacturing process of combining a base layer and an intermediate layer in a touch module according to Embodiment 2 of this application. FIG. 16 is a schematic diagram of a structure of a terminal device according to Embodiment 3 of this application.

Embodiment 1 and Embodiment 2 of this application are intended to resolve technical problems existing in a touch module and a terminal device in the conventional technology, to achieve a technical effect of reducing an overall thickness and weight of the touch module and making a terminal device product lighter and thinner. The touch module and the terminal device disclosed in Embodiment 1 and Embodiment 2 of this application have a better heat dissipation effect, a signal of a near field communication coil is not blocked, an overall structure of the touch module is simplified, and a yield loss is reduced.

Embodiment 1

As shown in FIG. 2 and FIG. 3, Embodiment 1 of this application discloses a touch module. The touch module includes a base layer 1, an intermediate layer 2, and a touch layer 3. The base layer 1 is a main control substrate having an M-FPC (Main Flexible Printed Circuit). As a main control element of the touch module, the M-FPC has a control circuit configured to implement a touch function and a near field communication function. The intermediate layer 2 is mounted on the base layer 1, and the intermediate layer 2 has a heat dissipation substrate 21 and foam 22. The heat dissipation substrate 21 and the foam 22 are attached to each other. The heat dissipation substrate 21 has an etched surface and a back surface that are opposite to each other, the near field communication coil 211 is etched on the etched surface, and the near field communication coil 211 is electrically connected to the M-FPC. The touch layer 3 is mounted on the intermediate layer 2, and the touch layer 3 has a flexible AMOLED screen 31 (including a PI (Polyimide), an LTPS (Low Temperature Poly-Silicon), and an OLED), a TP (touch panel 32), and a Pol 33 (Polarizor). The flexible AMOLED screen 31 is configured to display an image, and heat generated during running of the flexible AMOLED screen 31 is conducted to the heat dissipation substrate 21, to avoid that a service life of the flexible AMOLED screen 31 is shortened due to overheating, or avoid an adverse phenomenon such as a ghost image on the flexible AMOLED screen 31.

In the touch module in Embodiment 1, the near field communication coil 211 used for near field communication is integrated on the heat dissipation substrate 21, and two functions of heat dissipation and near field communication can be implemented only by etching a coil-shaped opening on the etched surface to form the near field communication coil 211. In a multiplexing manner, the touch module can be thin and light, and has a good heat dissipation effect. A near field communication signal is not blocked, and a yield is improved.

As shown in FIG. 2, in the touch module in Embodiment 1, the etched surface of the heat dissipation substrate 21 is a metal foil. The metal foil may be one of conductive films such as copper, a stainless steel alloy, aluminum, silver, and graphite. The metal foil has a heat dissipation part 212, and the near field communication coil 211 is etched around the heat dissipation part 212 towards an edge of the metal foil on the metal foil. A surface that is of the heat dissipation substrate 21 and that is not provided with the metal foil is attached to the base layer 1, and the foam 22 is attached to the metal foil.

Specifically, the foam 22 of the intermediate layer 2 is attached to the metal foil, separated from the base layer 1, and disposed between the heat dissipation substrate 21 and the touch layer 3. Heat generated when the flexible AMO-LED screen 31 works can be conducted to the heat dissipation part 212 on the metal foil in time. In addition, because the near field communication coil 211 is disposed around the heat dissipation part 212, heat generated when the near field communication coil 211 works is conducted from a periphery of the heat dissipation part 212 to the heat dissipation part 212 by using the metal foil. This finally achieves efficient heat dissipation.

In the touch module in Embodiment 1, the metal foil is used as an etched surface to form a coil structure, physical properties of the near field communication coil 211 are fully utilized, and the near field communication coil 211 is etched around the heat dissipation part 212. This greatly reduces a space requirement of the intermediate layer 2, and makes the intermediate layer 2 lighter and thinner while simultaneously implementing heat dissipation and near field communication functions.

In the touch module in Embodiment 1, a support part 23 is further disposed on the intermediate layer 2, one surface of the support part 23 is attached to a surface that is of the foam 22 and that is away from the heat dissipation substrate 21, and the other surface of the support part 23 is attached to the touch layer 3.

Specifically, the intermediate layer 2 has a three-layer structure, the foam 22 is attached above the heat dissipation substrate 21, and the support part 23 is attached above the foam 22. The support part 23 may adopt a film made of a stainless steel material (SUS (Japanese stainless steel material standard) alloy or Invar (Invar steel) alloy), to provide strength support between the foam 22 and the touch layer 3. Appearance stability of the screen in a manufacturing process is maintained, so that deformation of the flexible AMOLED screen 31 does not cause a large quantity of defects, and both the touch layer 3 and the intermediate layer 2 are supported.

As shown in FIG. 3, in the touch module in Embodiment 1, on the heat dissipation substrate 21, an area of the heat dissipation part 212 accounts for ½ to ⅔ of a total area of the heat dissipation substrate 21, and the near field communication coil 211 is etched around the heat dissipation part 212 towards an edge of the heat dissipation substrate 21.

Specifically, in Embodiment 1, the metal foil of the heat dissipation substrate 21 has two parts. One part is the heat dissipation part 212 used for heat dissipation, and the other part is the near field communication coil 211 used for near field communication. The heat dissipation part 212 does not cover the entire metal foil, but occupies only ½ to ⅔ of the total area of the heat dissipation substrate 21. The near field communication coil 211 is etched outwards around the heat dissipation part 212 to an edge of the metal foil layer by layer. The metal foil is made into such a structure, so that physical properties of the near field communication coil 211 can be fully used. The heat dissipation part 212 is disposed in an intermediate space where there is no near field communication coil 211, so that the heat dissipation part 212 not only can absorb heat generated by the touch layer 3, but also can absorb heat generated when the near field communication coil 211 and the M-FPC work, thereby achieving sufficient heat dissipation without interfering with a near field communication function of the near field communication coil 211.

In the touch module in Embodiment 1, proportions of the heat dissipation part 212 and the near field communication coil 211 on the heat dissipation substrate 21 are properly allocated, so that the heat dissipation substrate 21 can not only achieve a better heat dissipation effect and unimpeded near field communication, but also enhance hardness of a central area of the heat dissipation substrate 21.

In the touch module in Embodiment 1, a center of the heat dissipation part 212 coincides with a center of the heat dissipation substrate 21. In one aspect, heat is conducted from the central area of the heat dissipation substrate 21 to the base layer 1. In another aspect, heat generated by the near field communication coil 211 on the heat dissipation substrate 21 is evenly distributed, heat is also evenly conducted to the heat dissipation part 212, and the physical center of the heat dissipation part 212 and the physical center of the heat dissipation substrate 21 are at a same point. This further enhances hardness of the heat dissipation substrate 21.

In the touch module of Embodiment 1, to enhance stability between surfaces of the intermediate layer 2 and the base layer 1 that are attached to each other, the intermediate layer 2 and the base layer 1 are fastened together by using a connection part 4, thereby enhancing firmness of connection between the intermediate layer 2 and the base layer 1.

In the touch module in Embodiment 1, two ends of the connection part 4 are respectively connected to an edge of the heat dissipation substrate 21 and an edge of the base layer 1.

Specifically, in the touch module in Embodiment 1, an edge of the M-FPC is connected to an edge of the heat dissipation substrate 21 by using a connection portion 4. The connection portion 4 may be connected in various connection and fastening manners. Because the connection part 4 is disposed on the edge, heat dissipation performance and near field communication performance of the heat dissipation substrate 21 are not affected, and operating performance of the M-FPC is not affected. Therefore, when the connection part 4 is connected to the edge of the heat dissipation substrate 21 and the edge of the base layer 1, a signal of the near field communication coil 211 is not blocked, and a heat dissipation effect of the heat dissipation substrate 21 is not affected.

In the touch module in Embodiment 1, the connection part 4 is connected and fastened in a welding manner. Because an application environment of the touch module is usually compact in space, and required assembly and adaptation precision is very high, dimensions of the touch module are standardized, and the appearance of the touch module cannot have a convex or concave part, that is, the touch module needs to be as flat as possible, and a quadrilateral or circular structure is preferred. In addition, the manufacturing process cannot be very complex. Therefore, the connection part 4 of the touch module in Embodiment 1 is a solder joint, and the base layer 1 and the intermediate layer 2 are welded together in a welding manner, so that when the base layer 1 and the intermediate layer 2 are fastened, an overall appearance of the touch module is flat.

According to the touch module in Embodiment 1, the near field communication coil 211 can be integrated on the heat dissipation substrate 21, to perform functions of heat dissipation and near field communication simultaneously, thereby making the touch module lighter and thinner.

FIG. 4 to FIG. 8 show the following five steps in a manufacturing process of a touch module according to Embodiment 1.

Step 1: As shown in FIG. 4, the heat dissipation substrate 21 for heat dissipation is prepared, and the etched surface of the heat dissipation substrate 21 is a metal foil. The metal foil is etched into a coil structure with target dimensions, to form the heat dissipation part 212 located in a central area of the metal foil and the near field communication coil 211 surrounding the heat dissipation part 212. The metal foil may be one of conductive films such as copper, a stainless steel alloy, aluminum, silver, and graphite. Then, the metal foil is attached to a lower surface of the foam 22 by using a transfer printing or attachment process.

Step 2: As shown in FIG. 5, the support part 23 is attached to an upper surface of the foam 22, and the flexible AMOLED screen 31 is attached to an upper surface of the support part 23. The flexible AMOLED screen 31 is connected to the M-FPC by using a COF 5 (Chip on Film, a flexible circuit board bonded with an IC (Integrated Circuit)). Joints between the COF 5 and each of the M-FPC and the flexible AMOLED screen 31 are connected by using PI (Polyimide) bent portions. Two PI bent portions 6 at joints between the M-FPC and the flexible AMOLED screen 31 are separately mounted on an edge of the flexible AMOLED screen 31 and a mounting surface of the M-FPC. The PI bent portions 6 and the COF 5 form a screen connection assembly.

Step 3: As shown in FIG. 6, a touch panel 32 is prepared, and a TP FPC 7 (Touch Panel Flexible Printed Circuit, a flexible printed circuit of the touch panel 32) configured to be connected to the M-FPC is mounted on an edge of the touch panel 32.

Step 4: As shown in FIG. 7, the touch panel 32 on which the TP FPC 7 is mounted is completely attached to the upper surface of the flexible AMOLED screen 31, and the TP FPC 7 is connected to the mounting surface of the M-FPC. Because the touch panel 32 is located above the flexible AMOLED screen 31, for ease of bending, the screen connection component of the flexible AMOLED is connected to a position near an edge of the mounting surface of the M-FPC, and the TP FPC 7 is connected to a position near a center of the mounting surface of the M-FPC, to avoid physical entanglement and electrical interference between the screen connection component and the TP FPC 7.

Step 5: As shown in FIG. 8, the Pol 33 and a lens (the lens is not shown in the figure) are all attached to an upper surface of the touch panel 32. The M-FPC is reversely folded, so that an attachment surface (a surface opposite to the mounting surface) of the M-FPC is attached to a back surface (a lower surface opposite to the metal foil) of the heat dissipation substrate 21. Finally, the edge of the M-FPC and the edge of the heat dissipation substrate 21 are welded together through a solder joint.

The touch module disclosed in Embodiment 1 can be manufactured by using the foregoing manufacturing process. The process has a simple flow and easy operation, and is good for large-scale production.

Embodiment 2

As shown in FIG. 9 and FIG. 10, Embodiment 2 of this application discloses a touch module. The touch module in Embodiment 2 is further improved based on the touch module disclosed in Embodiment 1. Both a support film of an intermediate layer 2 and a near field communication coil 211 are integrated on a heat dissipation substrate 21, so that the heat dissipation substrate 21 has functions of supporting a touch layer 3, heat dissipation, and near field communication.

Specifically, the touch module in Embodiment 2 includes a base layer 1, the intermediate layer 2, and a touch layer 3. The base layer 1 is a main control substrate having an M-FPC. As a main control element of the touch module, the M-FPC has a control circuit configured to implement a touch function and a near field communication function. The intermediate layer 2 is mounted on the base layer 1, and the intermediate layer 2 has a heat dissipation substrate 21 and foam 22. The heat dissipation substrate 21 and the foam 22 are attached to each other. The heat dissipation substrate 21 has an etched surface and a back surface that are opposite to each other, the near field communication coil 211 is etched on the etched surface, and the near field communication coil 211 is electrically connected to the M-FPC. The touch layer 3 is mounted on the intermediate layer 2, and the touch layer 3 has a flexible AMOLED screen 31. The flexible AMOLED screen 31 is configured to display an image, and heat generated during the running of the flexible AMOLED screen 31 is conducted to the heat dissipation substrate 21, to avoid that a service life of the flexible AMOLED screen 31 is shortened due to overheating, or avoid an adverse phenomenon such as a ghost image on the flexible AMOLED screen 31.

In the touch module in Embodiment 2, the near field communication coil 211 used for near field communication is integrated on the heat dissipation substrate 21, and two functions of heat dissipation and near field communication can be implemented only by etching a coil-shaped opening on the etched surface to form the near field communication coil 211. In a multiplexing manner, the touch module can be thin and light, and has a good heat dissipation effect. A near field communication signal is not blocked, and a yield is improved.

As shown in FIG. 9, in the touch module in Embodiment 2, the etched surface of the heat dissipation substrate 21 is a support film, and the support film is a conductive film made of a stainless steel material (SUS alloy or Invar alloy). The support film has a heat dissipation part 212, and the near field communication coil 211 is etched around the heat dissipation part 212 towards an edge of the support film on the support film. The support film is attached to the touch layer 3, the back surface is attached to the foam 22, and a surface that is of the foam 22 and that is away from the heat dissipation substrate 21 is attached to the base layer 1.

Specifically, in the intermediate layer 2, a lower surface of the foam 22 is attached to a mounting surface (an upper surface) of the base layer 1, the back surface of the heat dissipation substrate 21 is attached to an upper surface of the foam 22, and the support film of the heat dissipation substrate 21 is attached below the touch layer 3. In Embodiment 2, the foam 22 is located between the heat dissipation substrate 21 and the base layer 1. The heat dissipation substrate 21 is attached to the touch layer 3. Heat generated when the flexible AMOLED screen 31 works can be conducted to the heat dissipation part 212 on the support film in time. In addition, because the near field communication coil 211 is disposed around the heat dissipation part 212, heat generated when the near field communication coil 211 works is conducted from a periphery of the heat dissipation part 212 to the heat dissipation part 212 by using the support film. This finally achieves highly efficient heat dissipation, further facilitates quick and effective heat dissipation, and achieves a better working effect of the near field communication coil 211.

In the touch module in Embodiment 2, the support film is used as an etched surface to form a coil structure, physical properties of the near field communication coil 211 are fully utilized, and the near field communication coil 211 is etched around the heat dissipation part 212. In addition, the physical properties of the support film are used to support both the touch layer 3 and the intermediate layer 2. This further reduces a space requirement of the intermediate layer 2, and further makes the intermediate layer 2 lighter and thinner while simultaneously implementing support, heat dissipation, and near field communication functions.

As shown in FIG. 10, in the touch module in Embodiment 2, on the heat dissipation substrate 21, an area of the heat dissipation part 212 accounts for ½ to ⅔ of a total area of the heat dissipation substrate 21, and the near field communication coil 211 is etched around the heat dissipation part 212 towards an edge of the heat dissipation substrate 21.

Specifically, in Embodiment 2, the support film of the heat dissipation substrate 21 has two parts. One part is the heat dissipation part 212 used for heat dissipation, and the other part is the near field communication coil 211 used for near field communication. The heat dissipation part 212 does not cover the entire support film, but occupies only ½ to ⅔ of the total area of the heat dissipation substrate 21. The near field communication coil 211 is etched outwards around the heat dissipation part 212 to an edge of the support film layer by layer. The support film is made into such a structure, physical properties of the near field communication coil 211 can be fully used, and the heat dissipation part 212 is disposed in an intermediate space where there is no near field communication coil 211, so that the heat dissipation part 212 not only can absorb heat generated by the touch layer 3, but also can absorb heat generated when the near field communication coil 211 and the M-FPC work, thereby achieving sufficient heat dissipation without interfering with a near field communication function of the near field communication coil 211.

In the touch module in Embodiment 2, proportions of the heat dissipation part 212 and the near field communication coil 211 on the heat dissipation substrate 21 are properly allocated, so that the heat dissipation substrate 21 can not only achieve a better heat dissipation effect and unimpeded near field communication, but also enhance hardness of a central area of the heat dissipation substrate 21.

In the touch module in Embodiment 2, a center of the heat dissipation part 212 coincides with a center of the heat dissipation substrate 21. In one aspect, heat is conducted from the central area of the heat dissipation substrate 21 to the base layer 1. In another aspect, heat generated by the near field communication coil 211 on the heat dissipation substrate 21 is evenly distributed, heat is also evenly conducted to the heat dissipation part 212, and the physical center of the heat dissipation part 212 and the physical center of the heat dissipation substrate 21 are at a same point, thereby further enhancing hardness of the heat dissipation substrate 21.

In the touch module of Embodiment 2, to enhance stability between surfaces of the intermediate layer 2 and the base layer 1 that are attached to each other, the intermediate layer 2 and the base layer 1 are fastened together by using a connection part 4. This enhances firmness of connection between the intermediate layer 2 and the base layer 1.

In the touch module in Embodiment 2, two ends of the connection part 4 are respectively connected to an edge of the heat dissipation substrate 21 and an edge of the base layer 1.

Specifically, in the touch module in Embodiment 2, an edge of the M-FPC is connected to an edge of the heat dissipation substrate 21 by using a connection portion 4. The connection portion 4 may be connected in various connection and fastening manners. Because the connection part 4 is disposed on the edge, heat dissipation performance and near field communication performance of the heat dissipation substrate 21 are not affected, and operating performance of the M-FPC is not affected. Therefore, when the connection part 4 is connected to the edge of the heat dissipation substrate 21 and the edge of the base layer 1, a signal of the near field communication coil 211 is not blocked, and a heat dissipation effect of the heat dissipation substrate 21 is not affected.

In the touch module of Embodiment 2, the connection part 4 passes through an edge of the foam 22. When the support film is an etched surface, the foam 22 is located between the heat dissipation substrate 21 and the base layer 1, and the connection part 4 passes through an edge of the foam 22 to sequentially connect the base layer 1, the foam 22, and the heat dissipation substrate 21. This further enhances firmness of connection between the intermediate layer 2 and the base layer 1.

In the touch module in Embodiment 2, the connection part 4 is connected and fastened in a welding manner. Because an application environment of the touch module is usually compact in space, and required assembly and adaptation precision is very high, dimensions of the touch module are standardized, and the appearance of the touch module cannot have a convex or concave part, that is, the touch module needs to be as flat as possible, and a quadrilateral or circular structure is preferred. In addition, the manufacturing process cannot be very complex. Therefore, the connection part 4 of the touch module in Embodiment 2 is a solder joint, and the base layer 1 and the intermediate layer 2 are welded together in a welding manner, so that when the base layer 1 and the intermediate layer 2 are fastened, an overall appearance of the touch module is flat.

According to the touch module in Embodiment 2, both the near field communication coil 211 and the support film can be integrated on the heat dissipation substrate 21, to support the flexible touch layer 3, and perform functions of heat dissipation and near field communication, thereby making the touch module lighter and thinner.

FIG. 11 to FIG. 15 show the following five steps in a manufacturing process of a touch module according to Embodiment 2.

Step 1: As shown in FIG. 11, the heat dissipation substrate 21 for heat dissipation is prepared, and an etched surface of the heat dissipation substrate 21 is a support film. The support film is etched into a coil structure with target dimensions, to form the heat dissipation part 212 located around a central area of the support film and the near field communication coil 211 surrounding the heat dissipation part 212. The support film may be one of conductive films such as copper, a stainless steel alloy, aluminum, silver, and graphite.

Step 2: As shown in FIG. 12, the support film is attached to an upper surface of the foam 22, and the flexible AMOLED screen 31 is attached to an upper surface of the support film. The flexible AMOLED screen 31 is connected to the M-FPC by using a COF 5. Joints between the COF 5 and each of the M-FPC and the flexible AMOLED screen 31 are connected by using PI bent portions 6. Two PI bent portions 6 at joints between the M-FPC and the flexible AMOLED screen 31 are separately mounted on an edge of the flexible AMOLED screen 31 and a mounting surface of the M-FPC. The PI bent portions 6 and the COF 5 form a screen connection assembly.

Step 3: As shown in FIG. 13, a touch panel 32 is prepared, and a TP FPC 7 configured to be connected to the M-FPC is mounted on an edge of the touch panel 32.

Step 4: As shown in FIG. 14, the touch panel 32 on which the TP FPC 7 is mounted is completely attached to the upper surface of the flexible AMOLED display 31, and the TP FPC 7 is connected to the mounting surface of the M-FPC. Because the touch panel 32 is located above the flexible AMOLED screen 31, for ease of bending, the screen connection component of the flexible AMOLED is connected to a position near an edge of the mounting surface of the M-FPC, and the TP FPC 7 is connected to a position near a center of the mounting surface of the M-FPC, to avoid physical entanglement and electrical interference between the screen connection component and the TP FPC 7.

Step 5: As shown in FIG. 15, the Pol 33 and a lens (the lens is not shown in the figure) are all attached to an upper surface of the touch panel 32. The M-FPC is reversely folded, so that an attachment surface (a surface opposite to the mounting surface) of the M-FPC is attached to the lower surface of the foam 22. Finally, the edge of the M-FPC, the edge of the foam 22, and the edge of the heat dissipation substrate 21 are welded together through solder joints.

The touch module disclosed in Embodiment 2 can be manufactured by using the foregoing manufacturing process. The process has a simple flow and easy operation, and is good for large-scale production.

Embodiment 3

As shown in FIG. 16, Embodiment 3 of this application discloses a terminal device 8, including a housing 81 and a display panel 82. The display panel 82 is disposed on the housing 81, and the touch module disclosed in Embodiment 1 or Embodiment 2 is disposed on the display panel 82.

The touch module in the foregoing description in Embodiment 1 or Embodiment 2 of this application is applied to the terminal device 8, so that the terminal device 8 may have better heat dissipation performance, a good near field communication effect, a lighter weight, and a thinner thickness, and is portable, wearable, and easy to use.

The terminal device is also referred to as user equipment (UE), and is a device that provides voice and/or data connectivity for a user, for example, a handheld device or a vehicle-mounted device that has a wireless connection function. Common terminal devices include a mobile phone, a tablet computer, a notebook computer, a palmtop computer, a mobile Internet device (MID), a wearable device such as a smartwatch, a smart band, or a pedometer, and the like.

The foregoing descriptions are merely specific implementations of the present invention, but the protection scope of the present invention is not limited thereto. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A touch module, comprising: a base layer, an intermediate layer, and a touch layer, wherein
the intermediate layer is mounted on the base layer, and the touch layer is mounted on the intermediate layer; and
the intermediate layer has a heat dissipation substrate and foam that are attached to each other, the heat dissipation substrate has an etched surface and a back surface that are opposite to each other, and a near field communication coil is etched on the etched surface; and
wherein a support film is further disposed on the intermediate layer, one surface of the support film is attached to a surface that is of the foam and that is away from the heat dissipation substrate, and an other surface of the support film is attached to the touch layer.

2. The touch module according to claim 1, wherein the etched surface is a metal foil, the metal foil has a heat dissipation part, and the near field communication coil is etched on the metal foil around the heat dissipation part towards an edge of the metal foil; and the back surface is attached to the base layer, and the metal foil is attached to the foam.

3. The touch module according to claim 1, wherein the etched surface is a support film, the support film has a heat dissipation part, and the near field communication coil is etched on the support film around the heat dissipation part towards an edge of the support film; and the support film is attached to the touch layer, the back surface is attached to the foam, and a surface that is of the foam and that is away from the heat dissipation substrate is attached to the base layer.

4. The touch module according to claim 2, wherein an area of the heat dissipation part accounts for ½ to ⅔ of a total area of the heat dissipation substrate.

5. The touch module according to claim 4, wherein a center of the heat dissipation part coincides with a center of the heat dissipation substrate.

6. The touch module according to claim 1, wherein the intermediate layer and the base layer are fastened together by using a connection part.

7. The touch module according to claim 6, wherein two ends of the connection part are respectively connected to an edge of the heat dissipation substrate and an edge of the base layer.

8. The touch module according to claim 7, wherein the connection part passes through an edge of the foam.

9. The touch module according to claim 6, wherein the connection part is connected and fastened in a welding manner.

10. A terminal device, comprising a housing and a display panel, wherein the display panel is disposed on the housing, and a touch module is disposed on the display panel;
wherein the touch module comprises: a base layer, an intermediate layer, and a touch layer, wherein the intermediate layer is mounted on the base layer, and the touch layer is mounted on the intermediate layer; and the intermediate layer has a heat dissipation substrate and foam that are attached to each other, the heat dissipation substrate has an etched surface and a back surface that are opposite to each other, and a near field communication coil is etched on the etched surface; and
wherein a support film is further disposed on the intermediate layer, one surface of the support film is attached to a surface that is of the foam and that is away from the heat dissipation substrate, and an other surface of the support film is attached to the touch layer.

11. The terminal device according to claim 10, wherein the etched surface is a metal foil, the metal foil has a heat dissipation part, and the near field communication coil is etched on the metal foil around the heat dissipation part towards an edge of the metal foil; and the back surface is attached to the base layer, and the metal foil is attached to the foam.

12. The terminal device according to claim 10, wherein the etched surface is a support film, the support film has a heat dissipation part, and the near field communication coil is etched on the support film around the heat dissipation part towards an edge of the support film; and the support film is attached to the touch layer, the back surface is attached to the foam, and a surface that is of the foam and that is away from the heat dissipation substrate is attached to the base layer.

13. The terminal device according to claim 11, wherein an area of the heat dissipation part accounts for ½ to ⅔ of a total area of the heat dissipation substrate.

14. The terminal device according to claim 13, wherein a center of the heat dissipation part coincides with a center of the heat dissipation substrate.

15. The terminal device according to claim 10, wherein the intermediate layer and the base layer are fastened together by using a connection part.

16. The terminal device according to claim 15, wherein two ends of the connection part are respectively connected to an edge of the heat dissipation substrate and an edge of the base layer.

17. The terminal device according to claim 16, wherein the connection part passes through an edge of the foam.

18. The terminal device according to claim 15, wherein the connection part is connected and fastened in a welding manner.

* * * * *